(12) United States Patent
Kim

(10) Patent No.: US 8,247,809 B2
(45) Date of Patent: Aug. 21, 2012

(54) ORGANIC LIGHT EMITTING DIODE DISPLAY

(75) Inventor: Tae-Jin Kim, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 13/050,176

(22) Filed: Mar. 17, 2011

(65) Prior Publication Data

US 2012/0091477 A1  Apr. 19, 2012

(30) Foreign Application Priority Data

Oct. 19, 2010 (KR) .................. 10-2010-0101931

(51) Int. Cl.
*H01L 51/52* (2006.01)
*H01L 33/34* (2010.01)

(52) U.S. Cl. ... 257/40; 257/100; 257/790; 257/E33.059; 257/E23.126

(58) Field of Classification Search .......... 257/40, 257/100, 790, E33.059, E51.02, E23.126
See application file for complete search history.

(56) References Cited

U.S. PATENT DOCUMENTS

| | | | | |
|---|---|---|---|---|
| 6,268,695 B1 * | 7/2001 | Affinito | | 313/504 |
| 6,522,067 B1 * | 2/2003 | Graff et al. | | 313/512 |
| 7,190,115 B2 * | 3/2007 | Tsuchiya et al. | | 313/512 |
| 2007/0194711 A1 * | 8/2007 | Matsuura et al. | | 313/512 |
| 2009/0278454 A1 * | 11/2009 | Fedorovskaya et al. | | 313/512 |
| 2010/0181903 A1 * | 7/2010 | Kim et al. | | 313/504 |
| 2010/0232162 A1 * | 9/2010 | Shin et al. | | 362/293 |
| 2010/0244073 A1 * | 9/2010 | Ito et al. | | 257/98 |
| 2011/0042707 A1 * | 2/2011 | Lim et al. | | 257/99 |
| 2011/0100458 A1 * | 5/2011 | Kang et al. | | 136/259 |
| 2011/0140163 A1 * | 6/2011 | Oh et al. | | 257/100 |
| 2011/0140164 A1 * | 6/2011 | Seo et al. | | 257/100 |
| 2011/0143079 A1 * | 6/2011 | Lee | | 428/76 |
| 2011/0151200 A1 * | 6/2011 | Erlat et al. | | 428/192 |
| 2011/0171764 A1 * | 7/2011 | Toonen et al. | | 438/29 |
| 2011/0260201 A1 * | 10/2011 | Klein et al. | | 257/99 |
| 2012/0091923 A1 * | 4/2012 | Kastner-Jung et al. | | 315/360 |

FOREIGN PATENT DOCUMENTS

| | | |
|---|---|---|
| JP | 3650366 | 2/2005 |
| KR | 10-2006-0023652 | 3/2006 |
| KR | 10-2007-0002465 | 1/2007 |
| KR | 10-2007-0042353 | 4/2007 |
| KR | 10-0796129 | 1/2008 |
| KR | 10-2010-0007860 | 1/2010 |

* cited by examiner

*Primary Examiner* — George Fourson, III
(74) *Attorney, Agent, or Firm* — Robert E. Bushnell, Esq.

(57) ABSTRACT

An organic light emitting diode (OLED) display comprises: a substrate; a display unit formed on the substrate and including an organic light emitting element; an interception layer positioned at the outside of the display unit on the substrate; and a thin film encapsulation layer which is formed with a stacked film of an inorganic film and an organic film, which has an end portion contacting the interception layer, and which covers the entire display unit and at least a part of the interception layer.

15 Claims, 8 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on Oct. 19, 2010 and there duly assigned Serial No. 10-2010-0101931.

BACKGROUND OF THE INVENTION

1. Field of the Invention

The present invention relates generally to an organic light emitting diode (OLED) display. More particularly, the present invention relates to an OLED display to which thin film encapsulation (TFE) technology is applied.

2. Description of the Related Art

An OLED display is a self luminescent display device that has a self luminescent organic light emitting element to display an image. The organic light emitting element may be deteriorated by penetration of external moisture and oxygen, as well as ultraviolet (UV) rays. Deterioration of the organic light emitting element due to such external factors causes a failure of the organic light emitting element and decreases the useful lifespan of the organic light emitting element, and thus packaging technology which seals the organic light emitting element is very important.

Thin film encapsulation technology, which is a packaging technology of the organic light emitting element, is known. Thin film encapsulation technology is technology regarding the covering of a display area of a substrate with a thin film encapsulation layer by alternately stacking at least one layer of an inorganic film and an organic film on the organic light emitting element. The thin film encapsulation layer is essential for embodying a slim OLED display to which a super-thin substrate is applied, and a flexible OLED display to which a flexible film substrate is applied.

However, the thin film encapsulation layer is effective in suppressing penetration of moisture and oxygen according to a stacked direction, i.e., a thickness direction of an inorganic film and an organic film, but it is weak in suppressing penetration of moisture and oxygen in a surface direction of the thin film encapsulation layer and penetration at the edge thereof. Therefore, as organic light emitting elements which are positioned at the edge of a display area deteriorate, a display failure may occur, and the useful lifespan of the OLED display is shortened.

The above information disclosed in this Background section is only for the enhancement of an understanding of the background of the described technology, and therefore it may contain information which does not form the prior art which is already known in this country to a person of ordinary skill in the art.

SUMMARY OF THE INVENTION

The present invention has been developed in an effort to provide an OLED display having the advantages of preventing a display failure and increasing the useful lifespan by suppressing penetration of external moisture and oxygen into an organic light emitting element by compensating for a weak point of a thin film encapsulation layer.

An exemplary embodiment of the invention provides an OLED display comprising: a substrate; a display unit which is formed on the substrate and which includes an organic light emitting element; an interception layer which is positioned at the outside of the display unit on the substrate; and a thin film encapsulation layer which is formed with a stacked film of an inorganic film and an organic film, and which has an end portion contacting the interception layer, and which covers the entire display unit and at least a part of the interception layer.

Part of the interception layer may protrude to the outside of the thin film encapsulation layer so as to have contact with outside air. The inorganic film and the organic film may be formed with a plurality of films, and each of a plurality of inorganic films and a plurality of organic films may have an end portion which contacts the interception layer.

An end portion of at least one of the plurality of inorganic films and an end portion of at least one of the plurality of organic films may sequentially contact an upper surface of the interception layer in a surface direction of the substrate. The plurality of inorganic films and the plurality of organic films may have a large width receding from the display unit.

The interception layer may be formed with a plurality of layers which are positioned at a predetermined distance from each other in a surface direction of the substrate.

The interception layer may include an inner interception layer which is adjacent to the display unit, an outer interception layer which is positioned at a predetermined distance from the inner interception layer, and a desiccant which is positioned between the inner interception layer and the outer interception layer. The thin film encapsulation layer may cover the inner interception layer and the desiccant, and some of the outer interception layer.

The interception layer may include a metal or inorganic matter.

The OLED display may further include a signal line positioned at the outside of the display unit on the substrate, and the interception layer may be made of the same material as that of the signal line. Alternatively, the interception layer may be formed with a signal line.

The organic light emitting element may include a pixel electrode, an organic emission layer and a common electrode, and the interception layer may be made of the same material as that of the pixel electrode in the same layer as that of the pixel electrode. Alternatively, the interception layer may be made of the same material as that of the common electrode in the same layer as that of the common electrode.

The interception layer may include an inorganic sealant. The interception layer may include at least one selected from a group consisting of $K_2O$, $Fe_2O_3$, $Sb_2O_3$, $ZnO$, $P_2O_6$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$, and $B_2O_3$.

In an OLED display of the present exemplary embodiment, an interception layer primarily intercepts penetration of external moisture and oxygen in a surface direction of a substrate, and whereas an interface edge of an inorganic film and an organic film is not exposed to the outside, a thin film encapsulation layer secondarily intercepts penetration of external moisture and oxygen. Therefore, the OLED display of the present exemplary embodiment suppresses deterioration of an organic light emitting element positioned at the edge of a display unit, thereby preventing a display failure and increasing useful lifespan.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
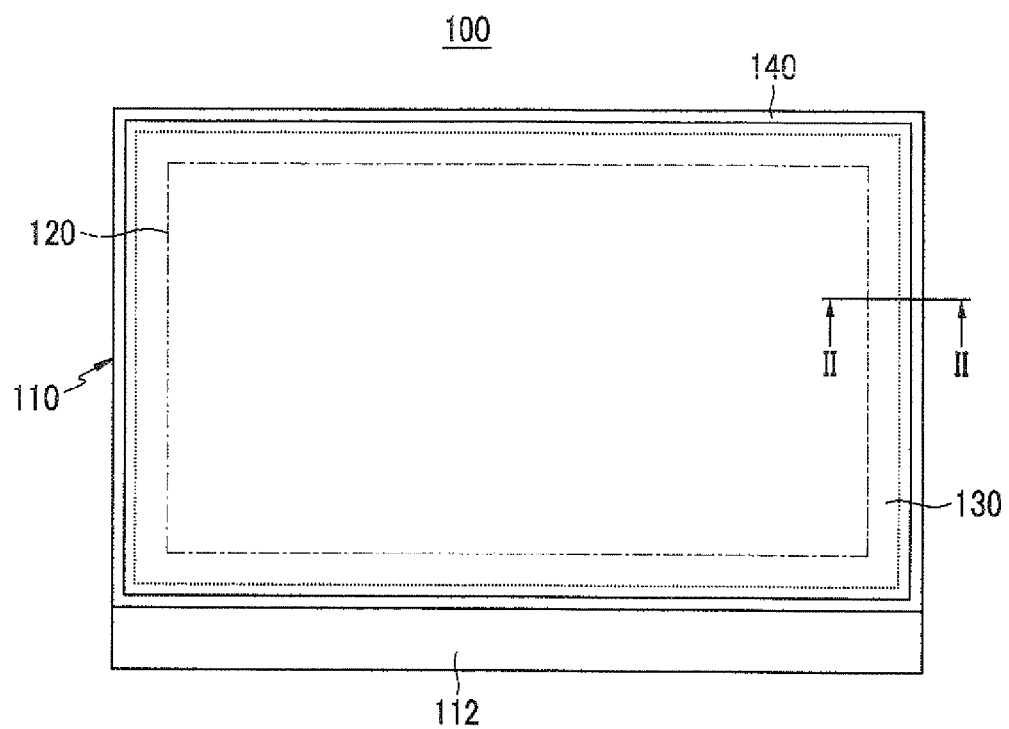
FIG. 1 is a top plan view illustrating an OLED display according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification. Furthermore, in the drawings, the size and thickness of each element are randomly represented for better understanding and ease of description, and the present invention is not limited thereto.

In the drawings, the thickness of layers, films, panels, regions, etc. are exaggerated for clarity. In the entire specification, when it is said that any part, such as a layer, film, region or plate, is positioned on another part, it means that the part is directly on the other part or separated the other part with at least one intermediate part.

Figure 2:
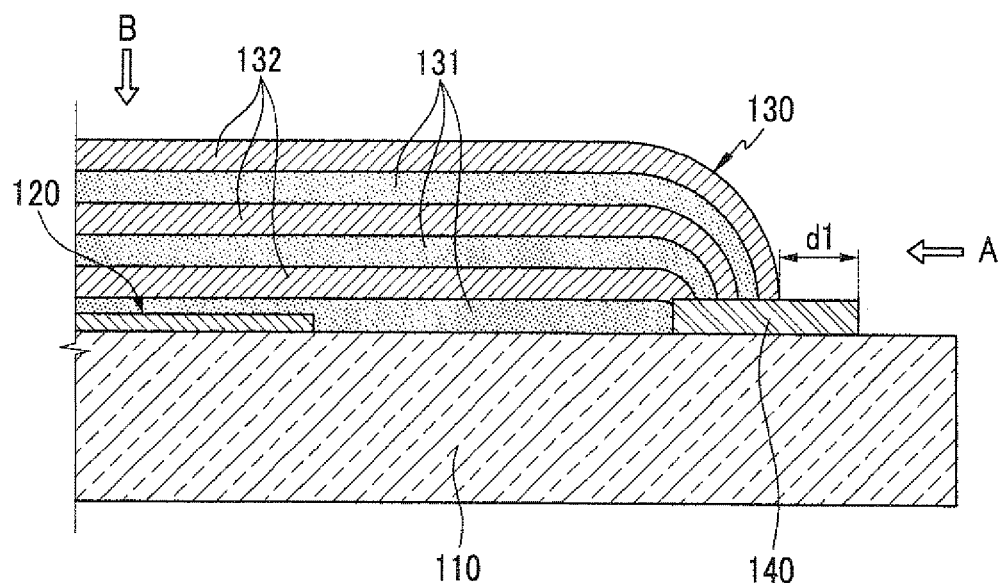
FIG. 2 is a cross-sectional view of the OLED display taken along line II-II of FIG. 1.

FIG. 1 is a top plan view illustrating an OLED display according to a first exemplary embodiment of the invention, and FIG. 2 is a cross-sectional view illustrating the OLED display taken along line II-II of FIG. 1.

Referring to FIGS. 1 and 2, an OLED display 100 according to a first exemplary embodiment includes a substrate 110, a display unit 120 formed on the substrate 110, a thin film encapsulation layer 130 which covers the display unit 120, and an interception layer 140 which contacts the thin film encapsulation layer 130 and which is positioned at the outside of the display unit 120.

The substrate 110 is formed as a transparent glass substrate or with a transparent high polymer film. Furthermore, the substrate 110 may be formed with a flexible transparent high polymer film, and in this case, the substrate 110 may embody a flexible OLED display. The display unit 120 includes a plurality of pixels, and a driving circuit and an organic light emitting element are formed in each pixel. The pixel is formed with a subpixel or a plurality of subpixels, and it forms the basic unit of an image display.

The driving circuit is formed with at least two thin film transistors, including a switching thin film transistor and a driving thin film transistor, and at least one capacitor. The organic light emitting element includes a pixel electrode, an organic emission layer, and a common electrode. The pixel electrode or the common electrode functions as a hole injection electrode, and the other one functions as an electron injection electrode. A detailed structure of the display unit 120 will be described below, and FIG. 1 schematically illustrates the display unit 120 as one layer.

A non-display area is positioned at the outside of a display area at which the display unit 120 is positioned. The thin film encapsulation layer 130 is formed in an area which is larger than the display unit 120 so as to cover and protect the entire display unit 120 and a part of an upper surface of the substrate 110 corresponding to a non-display area. A pad area 112 of the substrate 110, to which a flexible printed circuit board is attached, is not covered with the thin film encapsulation layer 130 but is exposed to the outside.

The thin film encapsulation layer 130 is directly formed on the display unit 120 so as to seal the driving circuit and the organic light emitting element. The thin film encapsulation layer 130 is formed with at least two inorganic films 131 and at least two organic films 132 which are alternately stacked one by one. FIG. 2 illustrates a case of forming the thin film encapsulation layer 130 by alternately stacking three inorganic films 131 and three organic films 132 one by one, but the quantity of the inorganic films 131 and the quantity of organic films 132 are not limited to the illustrated example.

The inorganic film 131 comprises an aluminum oxide ($Al_2O_3$) or silicone oxide ($SiO_2$). The organic film 132 includes epoxy, acrylate, or urethane acrylate. The inorganic film 131 performs the function of suppressing penetration of moisture and oxygen toward the display unit 120, and the organic film 132 performs the function of relieving internal stress of the inorganic film 131 or the function of filling a minute crack and a pinhole of the inorganic film 131.

The interception layer 140 is positioned at a predetermined distance from the display unit 120 in a non-display area. The interception layer 140 is formed of an inorganic film which does not permeate moisture and oxygen. That is, the interception layer 140 is formed of a metal or an inorganic material having an interception function relative to moisture and oxygen. The interception layer 140 is formed in a quadrangular frame shape enclosing the display unit 120 at a predetermined distance from the display unit 120 along the edge of the display unit 120.

The interception layer 140 is formed on the substrate 110 earlier than the thin film encapsulation layer 130. The thin film encapsulation layer 130 has an end portion which contacts the interception layer 140, and which covers the entire display unit 120 and at least a part of the interception layer 140. In this case, each of the plurality of organic films 132 and the plurality of inorganic films 131 constituting the thin film encapsulation layer 130 has an end portion which contacts the interception layer 140.

A part of the interception layer 140 protrudes to the outside of an end portion of the thin film encapsulation layer 130 so as to contact the outside air. In FIG. 2, a width of a portion of the interception layer 140 which protrudes to the outside of the thin film encapsulation layer 130 is designated by d1.

The thin film encapsulation layer 130 has a stacked structure consisting of the organic film 131 and the inorganic film 132 extending in a thickness direction (arrow direction B of FIG. 2) of the substrate 110, and thus intercepts penetration of moisture and oxygen in a thickness direction of the substrate 110 toward the display unit 120. Because the interception layer 140 is positioned at the outside of the display unit 120, the interception layer 140 intercepts penetration of moisture and oxygen in a surface direction of the substrate 110.

In this way, because the interception layer 140 contacts the outside air at the outside of the thin film encapsulation layer 130, the interception layer 140 can effectively intercept penetration of moisture and oxygen in the surface direction of the substrate 110. Furthermore, since an end portion of the thin film encapsulation layer 130 is positioned so as to contact the interception layer 140 without being exposed to the outside, a sealing effect of the display unit 120 can be improved.

If it is assumed that the inorganic film 131 and the organic film 132 are sequentially stacked without the interception layer 140, and thus the edge of an interface of the inorganic film 131 and the organic film 132 is exposed to the outside, penetration of external moisture and oxygen into the thin film encapsulation layer 130 along the edge of an interface of the inorganic film 131 and the organic film 132 deteriorates the organic light emitting element of the display unit 120.

However, in the present exemplary embodiment of the invention, in a surface direction of the substrate 110, the interception layer 140 primarily intercepts penetration of external moisture and oxygen, and as the interface edge of the inorganic film 131 and the organic film 132 is not exposed to the outside, the thin film encapsulation layer 130 secondarily intercepts penetration of external moisture and oxygen. Therefore, the OLED display 100 according to the present exemplary embodiment suppresses deterioration of an organic light emitting element which is positioned at the edge of the display unit 120, thereby preventing a display failure and increasing useful lifespan.

Furthermore, when forming the thin film encapsulation layer 130 by sequentially stacking the inorganic film 131 and the organic film 132, while an end portion of the inorganic film 131 and the organic film 132 contacts the interception layer 140 by a height of the primarily formed interception layer 140, the center of the inorganic film 131 and the organic film 132 is formed to be convex, as shown in FIG. 2. Thereby, an end portion of at least one inorganic film 131 and an end portion of at least one organic film 132 sequentially contact an upper surface of the interception layer 140 in a surface direction (arrow direction A of FIG. 2) of the substrate 110.

When forming the thin film encapsulation layer 130 by sequentially stacking the inorganic film 131 and the organic film 132, a layer which is formed later can be formed with a large width. Accordingly, while a layer which is formed later completely covers a layer which is first formed, end portions thereof sequentially contact the interception layer 140. In an upper surface of the interception layer 140, because a stacking arrangement of the inorganic film 131 and the organic film 132 is represented in a surface direction of the substrate 110, the thin film encapsulation layer 140 can have the same sealing function in a surface direction as in a thickness direction.

In the OLED display 100, the interception layer 140 is made of a metal or an inorganic material. The interception layer 140 may be a signal line which is positioned at a non-display area or a separate metal layer which is made of the same material as which of a signal line. In this case, the signal line is formed with a control signal line or a power source voltage line which connects an electrode of the display unit 120 and a pad electrode (not shown) of the pad area 112.

Furthermore, the interception layer 140 is made of the same material as that of any one of a plurality of electrodes constituting an organic light emitting element. For example, the interception layer 140 may be a metal layer which is made of the same material as that of a pixel electrode or a common electrode.

The interception layer 140 includes an inorganic sealant. The inorganic sealant includes at least one selected from a group consisting of $K_2O$, $Fe_2O_3$, $Sb_2O_3$, $ZnO$, $P_2O_6$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$, and $B_2O_3$. A constituent material of the interception layer 140 is not limited to the above-described example, and can be variously changed.

The foregoing exemplary embodiment illustrates a case where the interception layer 140 is a single layer.

Figure 3:
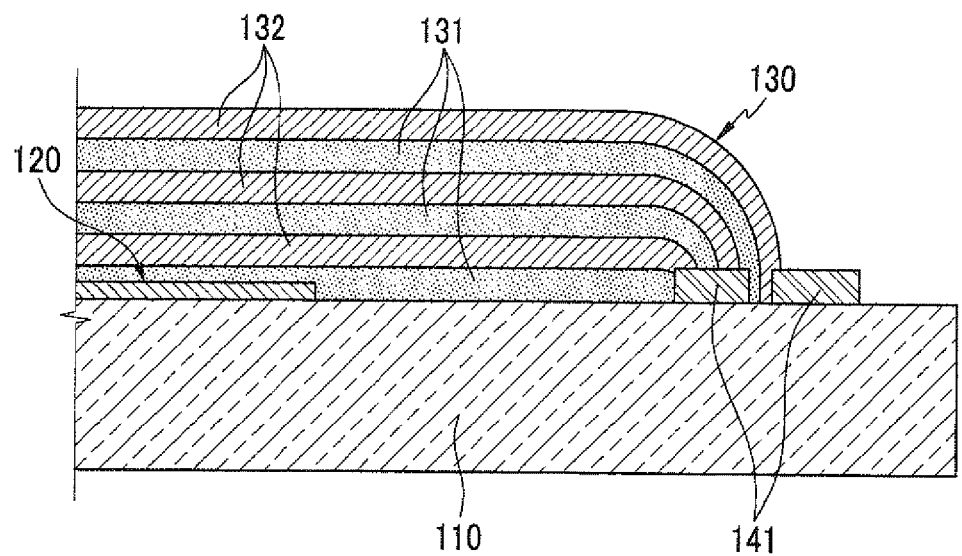
FIG. 3 is a partially enlarged cross-sectional view of an OLED display, and illustrates an exemplary variation of an interception layer which is shown in FIG. 2.

FIG. 3 is a partially enlarged cross-sectional view of an OLED display, and illustrates an exemplary variation of an interception layer which is shown in FIG. 2. Thus, as shown in FIG. 3, the interception layer 141 can be formed in a plurality of layers which are positioned at a predetermined distance from each other in a surface direction of the substrate 110.

Figure 4:
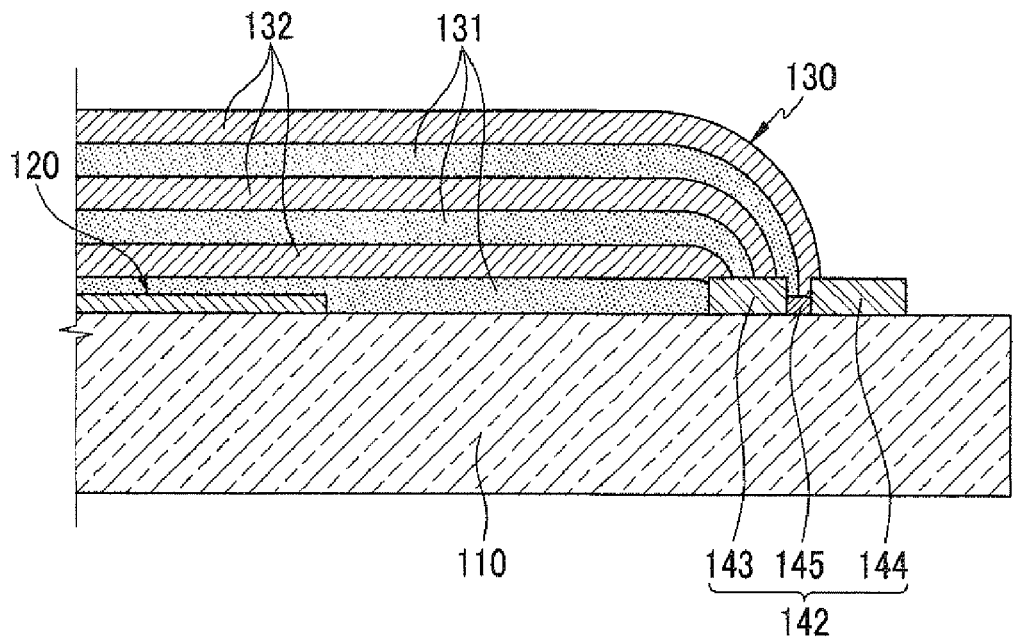
FIG. 4 is a partially enlarged cross-sectional view of an OLED display according to a second exemplary embodiment of the invention.

FIG. 4 is a partially enlarged cross-sectional view illustrating an OLED display according to a second exemplary embodiment of the invention.

Referring to FIG. 4, in the OLED display according to the second exemplary embodiment, an interception layer 142 is divided into an inner interception layer 143 and an outer interception layer 144, and is formed in the same configuration as that of the first exemplary embodiment except that a desiccant 145 is positioned between the inner interception layer 143 and the outer interception layer 144. Like reference numerals designate like elements as those of the first exemplary embodiment.

The interception layer 142 includes the inner interception layer 143 adjacent to the display unit 120, the outer interception layer 144 which is positioned at a predetermined distance from the inner interception layer 143, and the desiccant 145 which is positioned between the inner interception layer 143 and the outer interception layer 144. The inner interception layer 143 and the outer interception layer 144 have the same thickness, and the desiccant 145 has a thickness which is smaller than that of the inner interception layer 143 and the outer interception layer 144. The thin film encapsulation layer 130 covers the inner interception layer 143 and the desiccant 145, and a part of the outer interception layer 144.

The desiccant 145 absorbs external moisture and oxygen which penetrate the outer interception layer 144 or the thin film encapsulation layer 130 in a surface direction of the substrate 110 so as to prevent external moisture and oxygen from being injected into the display unit 120. Therefore, the OLED display according to the second exemplary embodiment can strengthen a sealing function of the display unit 120 by using the desiccant 145, together with the inner and outer interception layers 143 and 144, respectively, and the thin film encapsulation layer 130.

Figure 5:
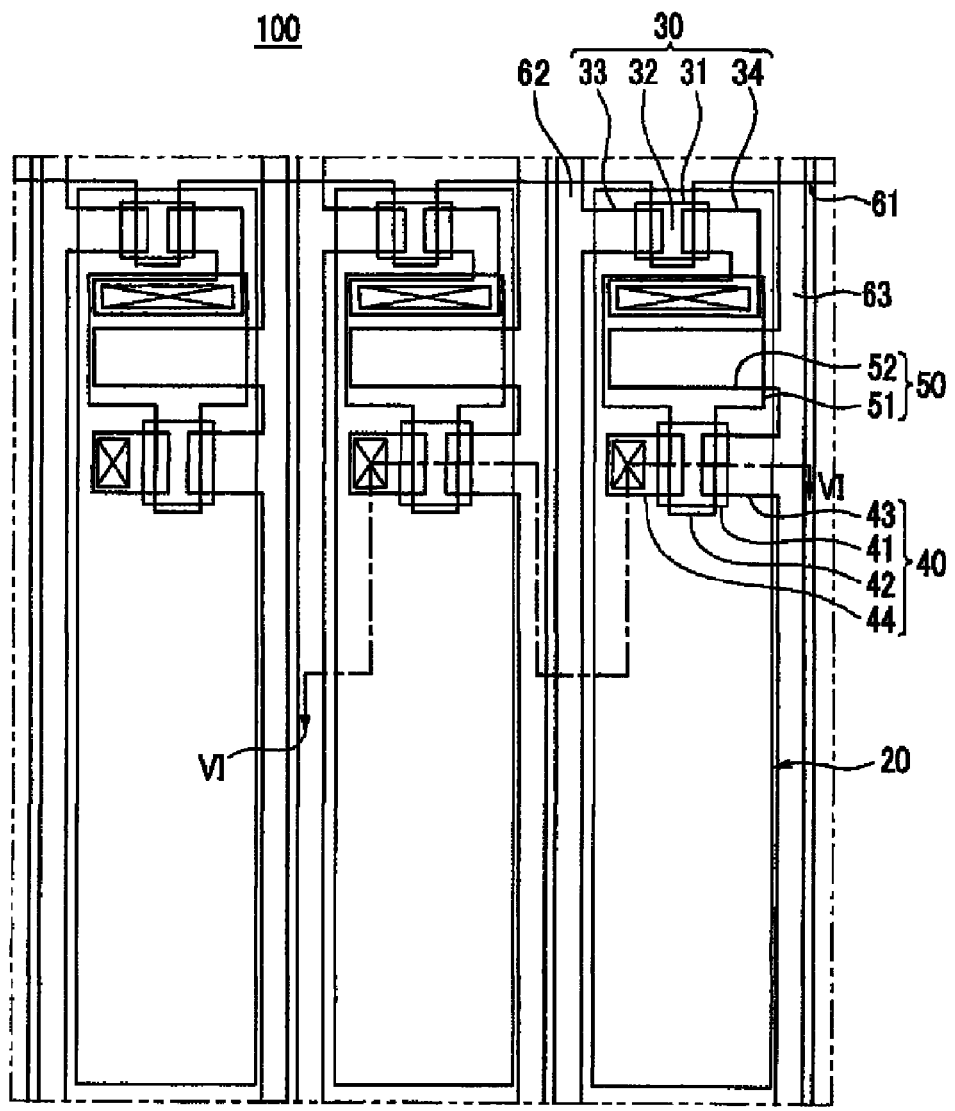
FIG. 5 is a layout view of a display unit of the OLED display which is shown in FIG. 1.
Figure 6:
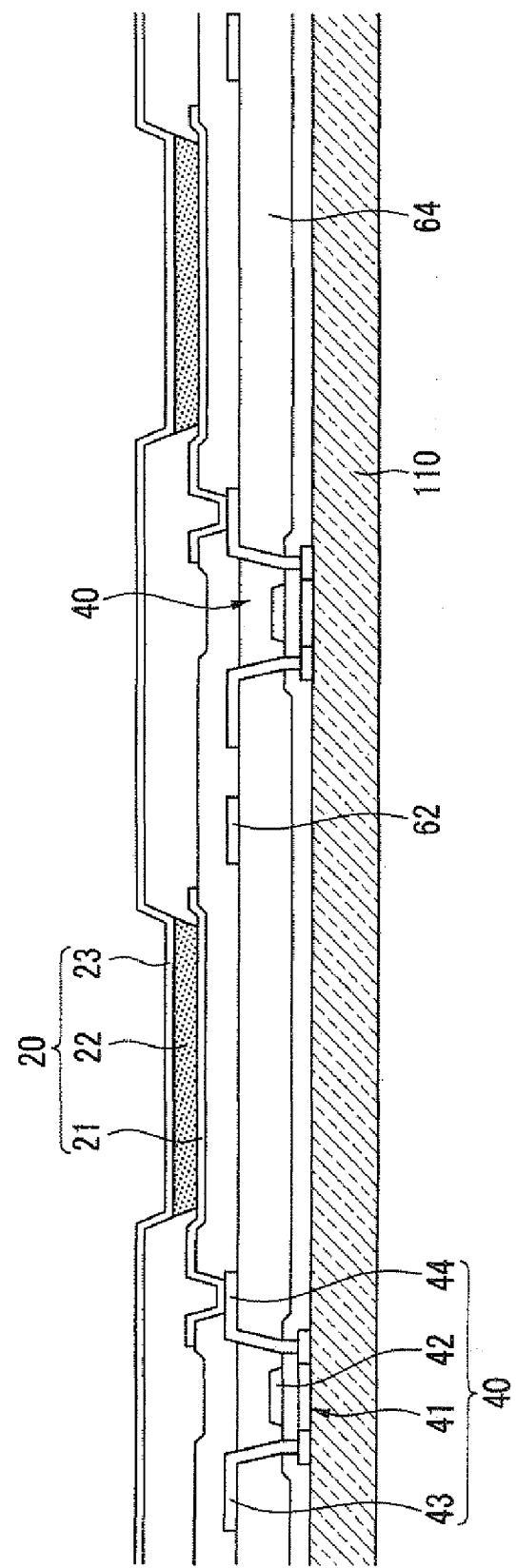
FIG. 6 is a cross-sectional view of the display unit taken along line VI-VI of FIG. 5.

FIG. 5 is a layout view of a display unit of the OLED display which is shown in FIG. 1, and FIG. 6 is a cross-sectional view of the display unit taken along line VI-VI of FIG. 5. The structure of the display unit which is described below is an illustration, and the OLED display of the first exemplary embodiment and the OLED display of the second exemplary embodiment are not limited to the following structure.

Referring to FIGS. 5 and 6, the OLED display 100 includes a switching thin film transistor 30, a driving thin film transistor 40, a capacitor 50, and an organic light emitting element 20 formed in each pixel. The OLED display 100 further includes a gate line 61 disposed in one direction, and a common power source voltage line 63 and a data line 62 intersecting the gate line 61 in an insulation state.

The organic light emitting element 20 includes a pixel electrode 21, an organic emission layer 22 and a common electrode 23. The pixel electrode 21 may be a hole injection electrode (anode), and the common electrode 23 may be an electron injection electrode (cathode). In this case, the organic emission layer 22 includes a hole injection layer (HIL), a hole transporting layer (HTL), an emission layer, an electron transporting layer (ETL), and an electron injection layer (EIL) which are sequentially stacked from the pixel electrode 21. In this case, at least one of the remaining layers, except for the emission layer, may be omitted.

When holes and electrons are injected from the pixel electrode 21 and the common electrode 23 into the organic emission layer 22, and when excitons in which the injected holes and electrons are coupled drop from an exited state to a ground state, light is emitted.

The pixel electrode 21 is formed in a transmissive conductive layer, and the common electrode 23 is formed in a reflective conductive layer. In this case, light emitted from the organic emission layer 22 is reflected by the common electrode 23, and is emitted to the outside via the pixel electrode 21 and the substrate 110. Such a light emitting structure is referred to as a rear light emitting type. The pixel electrode 21 comprises ITO, IZO, $In_2O_3$, or ZnO, and the common electrode 23 comprises silver (Ag), aluminum (Al), a silver alloy, or an aluminum alloy.

The capacitor 50 includes a first capacitor plate 51 and a second capacitor plate 52 having an interlayer insulating layer 64 interposed therebetween. The interlayer insulating layer 64 is made of a dielectric material. A capacitor capacity is determined by charges which are stored in the capacitor 50 and a voltage between the first capacitor plate 51 and the second capacitor plate 52.

The switching thin film transistor 30 includes a switching semiconductor layer 31, a switching gate electrode 32, a switching source electrode 33, and a switching drain electrode 34. The driving thin film transistor 40 includes a driving semiconductor layer 41, a driving gate electrode 42, a driving source electrode 43, and a driving drain electrode 44.

The switching thin film transistor 30 is used as a switch which selects a pixel to emit light. The switching gate electrode 32 is connected to the gate line 61. The switching source electrode 33 is connected to the data line 62. The switching drain electrode 34 is separated from the switching source electrode 33, and is connected to the first capacitor plate 51.

The driving thin film transistor 40 applies a driving voltage to the pixel electrode 21 so as to cause the organic emission layer 22 of a selected pixel to emit light. The driving gate electrode 42 is connected to the first capacitor plate 51, and the driving source electrode 43 and the second capacitor plate 52 are connected to the common power source voltage line 63. The driving drain electrode 44 is connected to the pixel electrode 21 of the organic light emitting element 20 through a contact hole.

The switching thin film transistor 30 is operated by a scan voltage which is applied to the gate line 61 so as to perform a function of transferring a data voltage, which is applied to the data line 62, to the driving thin film transistor 40.

A voltage corresponding to the difference between a common voltage, which is applied from the common power source voltage line 63 to the driving thin film transistor 40, and a data voltage, which is transferred from the switching thin film transistor 30, is stored in the capacitor 50, and a current corresponding to a voltage which is stored in the capacitor 50 flows to the organic light emitting element 20 through the driving thin film transistor 40, and thus the organic emission layer 22 emits light.

Figure 7:
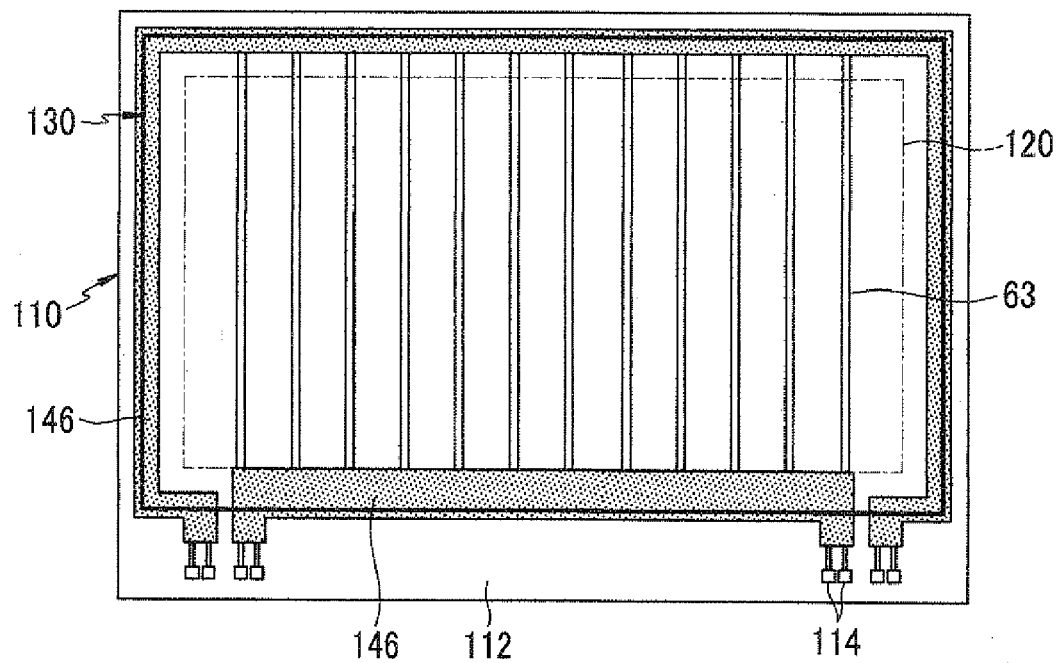
FIG. 7 is a top plan view illustrating an OLED display according to a third exemplary embodiment of the invention.

FIG. 7 is a top plan view illustrating an OLED display according to a third exemplary embodiment of the invention.

Referring to FIG. 7, a signal line enclosing the display unit 120 is positioned on a non-display area. The signal line is made of a metal, and an interception layer 146 is formed with the signal line. The signal line is formed with a control signal line or a power source voltage line which connects an electrode of the display unit 120 and a pad electrode 114 of a pad area 112. FIG. 7 illustrates a case where the signal line is a power source voltage line connected to the common power source voltage line 63, but the kind of signal line is not limited to a power source voltage.

Figure 8:
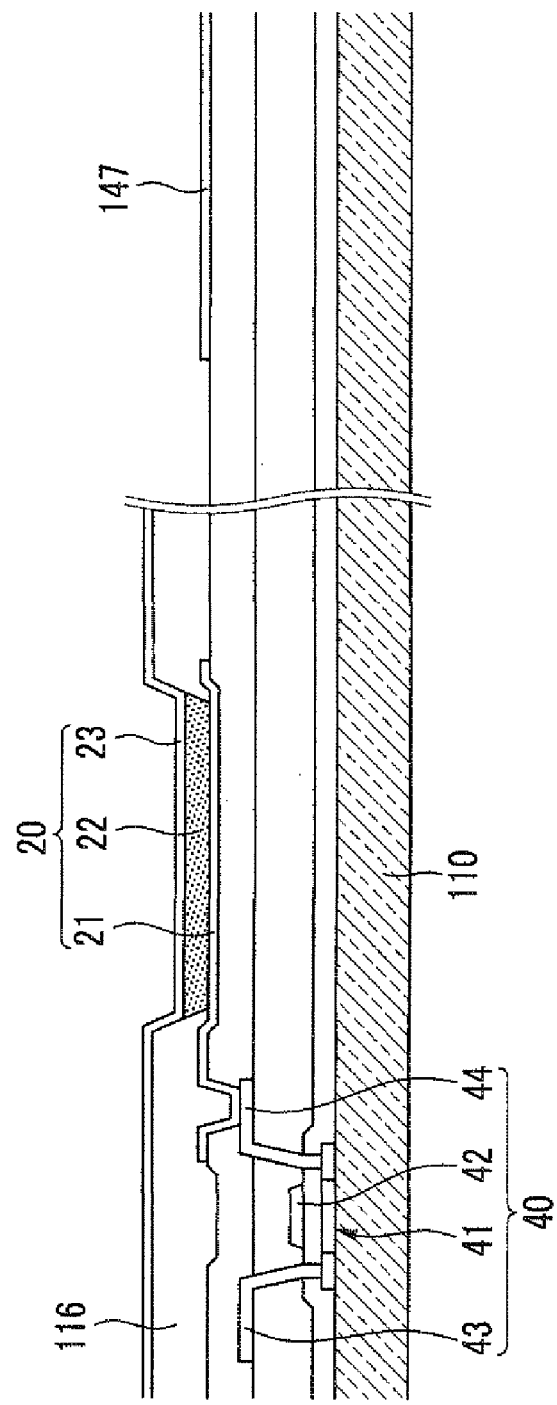
FIG. 8 is a partially enlarged cross-sectional view illustrating an OLED display according to a fourth exemplary embodiment of the invention.

FIG. 8 is a partially enlarged cross-sectional view illustrating an OLED display according to a fourth exemplary embodiment of the invention.

Referring to FIG. 8, an interception layer 147 is made of the same material as that of the pixel electrode 21 and is disposed in the same layer as the pixel electrode 21. That is, in a process of patterning the pixel electrode 21, the interception layer 147 is formed by maintaining a part of the pixel electrode 21 in a non-display area. In FIG. 8, reference numeral 116 indicates a pixel defining film. After the interception layer 147 is formed, by not forming the pixel defining film 116 in a non-display area or by removing a part of the pixel defining film 116, the interception layer 147 is not covered with the pixel defining film 116.

Figure 9:
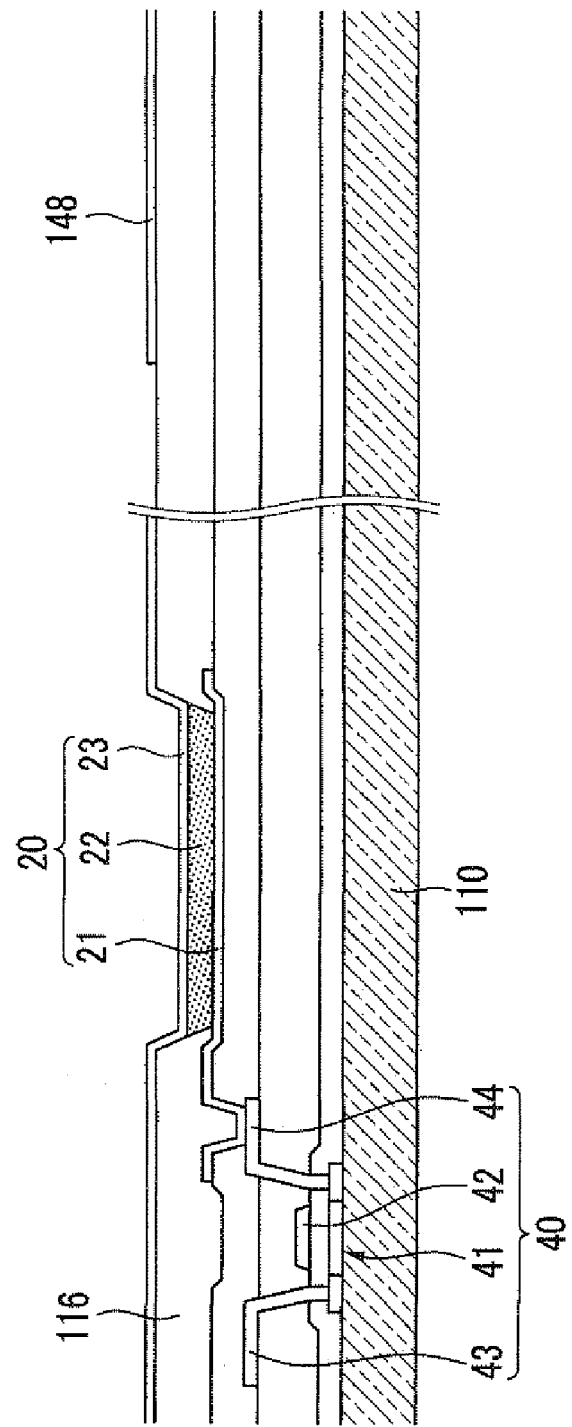
FIG. 9 is a partially enlarged cross-sectional view illustrating an OLED display according to a fifth exemplary embodiment of the invention.

FIG. 9 is a partially enlarged cross-sectional view illustrating an OLED display according to a fifth exemplary embodiment of the invention.

Referring to FIG. 9, an interception layer 148 is made of the same material as that of the common electrode 23 and is disposed in the same layer as the common electrode 23. That is, in a process of patterning the common electrode 23, the interception layer 148 is formed by maintaining a part of the common electrode 23 in a non-display area.

The forming material and the disposition structure of the interception layer are not limited to the above-described example and can be variously changed.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode (OLED) display, comprising:
    a substrate;
    a display unit formed on the substrate and comprising an organic light emitting element;
    an interception layer positioned at the outside of the display unit on the substrate; and
    a thin film encapsulation layer which comprises a stacked film structure of an inorganic film and an organic film, and which has an end portion contacting the interception layer, said thin film encapsulation layer covering an entirety of the display unit and at least a part of the interception layer.

2. The OLED display of claim 1, wherein the part of the interception layer protrudes outside the thin film encapsulation layer so as to have contact with outside air.

3. The OLED display of claim 2, wherein each of the inorganic film and the organic film comprises a plurality of films, and each of the inorganic films and the organic films has an end portion contacting the interception layer.

4. The OLED display of claim 3, wherein an end portion of at least one of the inorganic films and an end portion of at least one of the organic films sequentially contact an upper surface of the interception layer in a surface direction of the substrate.

5. The OLED display of claim 3, wherein the inorganic films and the organic films have a large width receding from the display unit.

6. The OLED display of claim 2, wherein the interception layer comprises a plurality of layers which are positioned at a predetermined distance from each other in a surface direction of the substrate.

7. The OLED display of claim 2, wherein the interception layer comprises an inner interception layer which is adjacent to the display unit, an outer interception layer which is positioned at a predetermined distance from the inner interception layer, and a desiccant which is positioned between the inner interception layer and the outer interception layer.

8. The OLED display of claim 7, wherein the thin film encapsulation layer covers the inner interception layer and the desiccant, and some of the outer interception layer.

9. The OLED display of claim 1, wherein the interception layer comprises one of a metal and an inorganic material.

10. The OLED display of claim 1, further comprising a signal line positioned at an outside of the display unit on the substrate, wherein the interception layer is made of a same material as the signal line.

11. The OLED display of claim 1, further comprising a signal line positioned at an outside of the display unit on the substrate, wherein the interception layer is formed with the signal line.

12. The OLED display of claim 1, wherein the organic light emitting element comprises a pixel electrode, an organic emission layer and a common electrode, and the interception layer is made of a same material as the pixel electrode and is disposed in a same layer as the pixel electrode.

13. The OLED display of claim 1, wherein the organic light emitting element comprises a pixel electrode, an organic emission layer and a common electrode, and the interception layer is made of a same material as the common electrode and is disposed in a same layer as the common electrode.

14. The OLED display of claim 1, wherein the interception layer comprises an inorganic sealant.

15. The OLED display of claim 14, wherein the interception layer comprises at least one selected from a group consisting of $K_2O$, $Fe_2O_3$, $Sb_2O_3$, $ZnO$, $P_2O_6$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rb_2O$, $Rh_2O$, $CuO$, and $B_2O_3$.

* * * * *